US008845909B2

United States Patent
Shen

(10) Patent No.: US 8,845,909 B2
(45) Date of Patent: Sep. 30, 2014

(54) PROCESS OF FABRICATING HEAT DISSIPATION SUBSTRATE

(71) Applicant: Tzu-Shih Shen, Hsinchu (TW)

(72) Inventor: Tzu-Shih Shen, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/905,134

(22) Filed: May 30, 2013

(65) Prior Publication Data

US 2013/0260018 A1 Oct. 3, 2013

Related U.S. Application Data

(62) Division of application No. 13/293,130, filed on Nov. 10, 2011, now abandoned.

(30) Foreign Application Priority Data

Aug. 19, 2011 (TW) .............................. 100129781 A

(51) Int. Cl.
| | |
|---|---|
| H01L 29/207 | (2006.01) |
| H01L 23/14 | (2006.01) |
| H01L 21/48 | (2006.01) |
| F28F 13/00 | (2006.01) |
| H01L 33/64 | (2010.01) |
| H01L 23/13 | (2006.01) |
| F28D 21/00 | (2006.01) |
| F28F 21/08 | (2006.01) |

(52) U.S. Cl.
CPC .............. *H01L 33/64* (2013.01); *H01L 23/142* (2013.01); *H01L 21/4878* (2013.01); *H01L 2224/48091* (2013.01); *F28F 13/00* (2013.01); *F28D 2021/0029* (2013.01); *F28F 21/085* (2013.01); *H01L 23/13* (2013.01)
USPC ................... 216/19; 216/17; 216/41; 216/51; 216/52; 216/53; 216/58; 216/72; 216/75; 216/78; 216/100; 216/105; 216/106; 257/687; 257/702; 257/703; 257/712; 257/719; 257/729; 205/291

(58) Field of Classification Search
CPC ...................... H01L 21/32139; H01L 21/3065; H01L 21/31116; H01L 2224/02; H01L 2224/04; H01L 2224/97; H01L 21/3116
USPC ......... 257/702, 703, 711, 712, 717, 729, 687, 257/719; 216/13, 17, 19, 41, 51–53, 58, 67, 216/72, 75, 78, 95, 100, 105–106
See application file for complete search history.

(56) References Cited

U.S. PATENT DOCUMENTS

| | | | | |
|---|---|---|---|---|
| 3,217,089 | A * | 11/1965 | Beck .............................. | 174/261 |
| 7,244,965 | B2 * | 7/2007 | Andrews et al. ................ | 257/98 |
| 7,786,501 | B2 * | 8/2010 | Shen ................................ | 257/99 |
| 7,838,338 | B2 * | 11/2010 | Shen ............................ | 438/110 |

FOREIGN PATENT DOCUMENTS

| | | |
|---|---|---|
| JP | 10-195623 | 7/1998 |
| TW | 280086 | 7/1996 |
| TW | 200915628 | 4/2009 |

OTHER PUBLICATIONS

"Office Action of Taiwan Counterpart Application", issued on Oct. 14, 2013, p. 1-p. 6, TW application No. 100129781.

* cited by examiner

*Primary Examiner* — Cathy Lam
(74) *Attorney, Agent, or Firm* — Jianq Chyun IP Office

(57) ABSTRACT

A process of fabricating a heat dissipation substrate is provided. A metal substrate having an upper surface, a lower surface, first recesses located on the upper surface and second recesses located on the lower surface is provided. The metal substrate is divided into carrier units and connecting units connecting the carrier units. A first and a second insulating materials are respectively filled into the first and the recesses. A first conductive layer is formed on the upper surface and the first insulating material. A second conductive layer is formed on the lower surface and the second insulating material. The first and the second conductive layers are patterned to form a first and a second patterned conductive layers. The first and the second insulating materials are taken as an etching mask to etch the connecting units of the metal substrate so as to form a plurality of individual heat dissipation substrates.

3 Claims, 3 Drawing Sheets

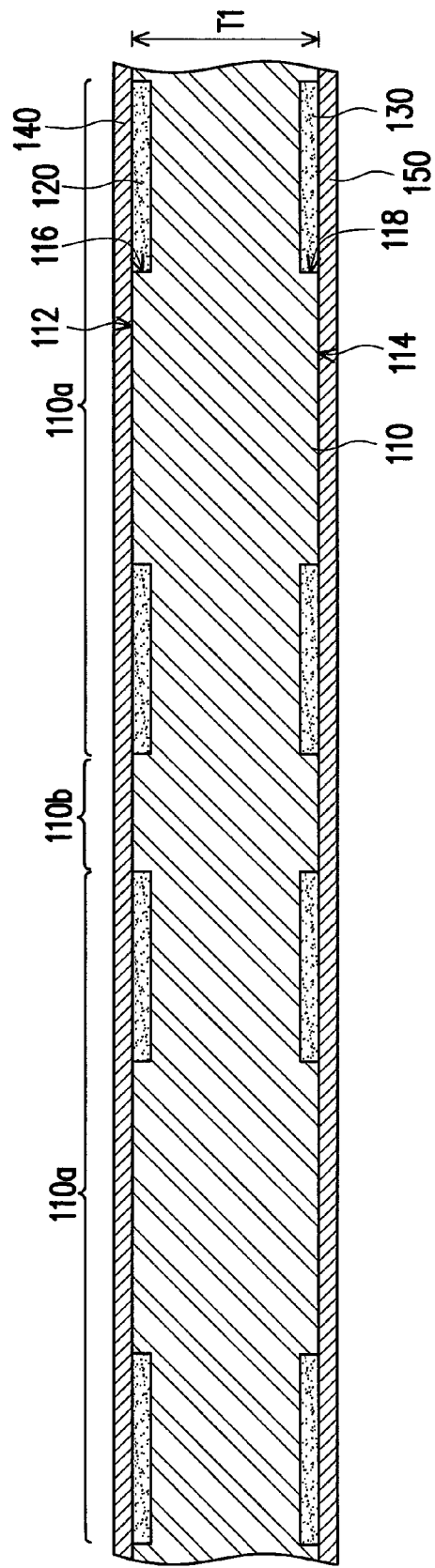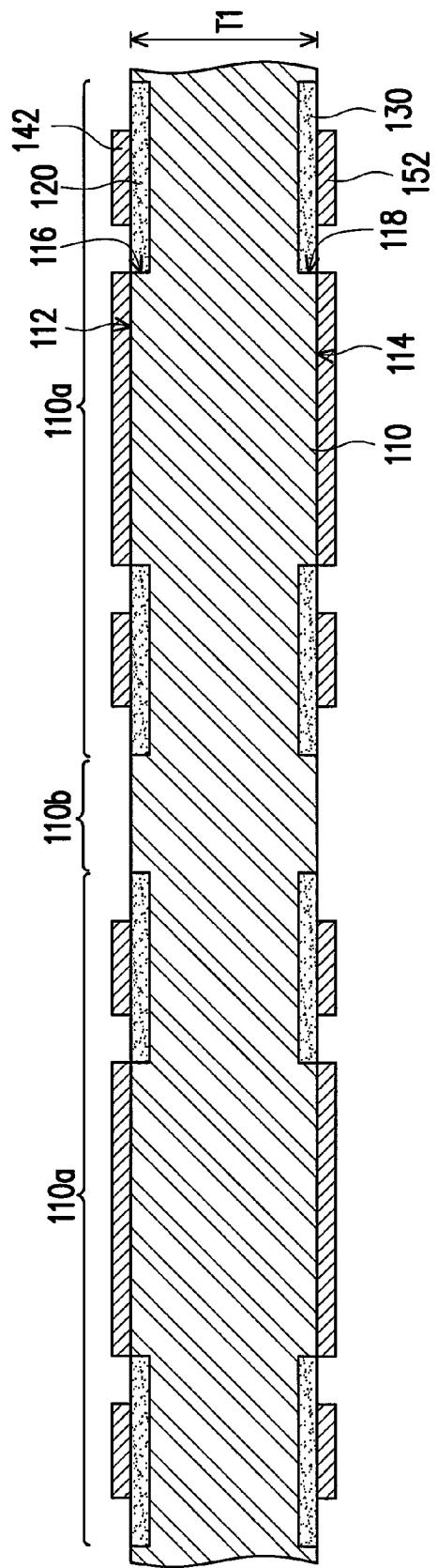

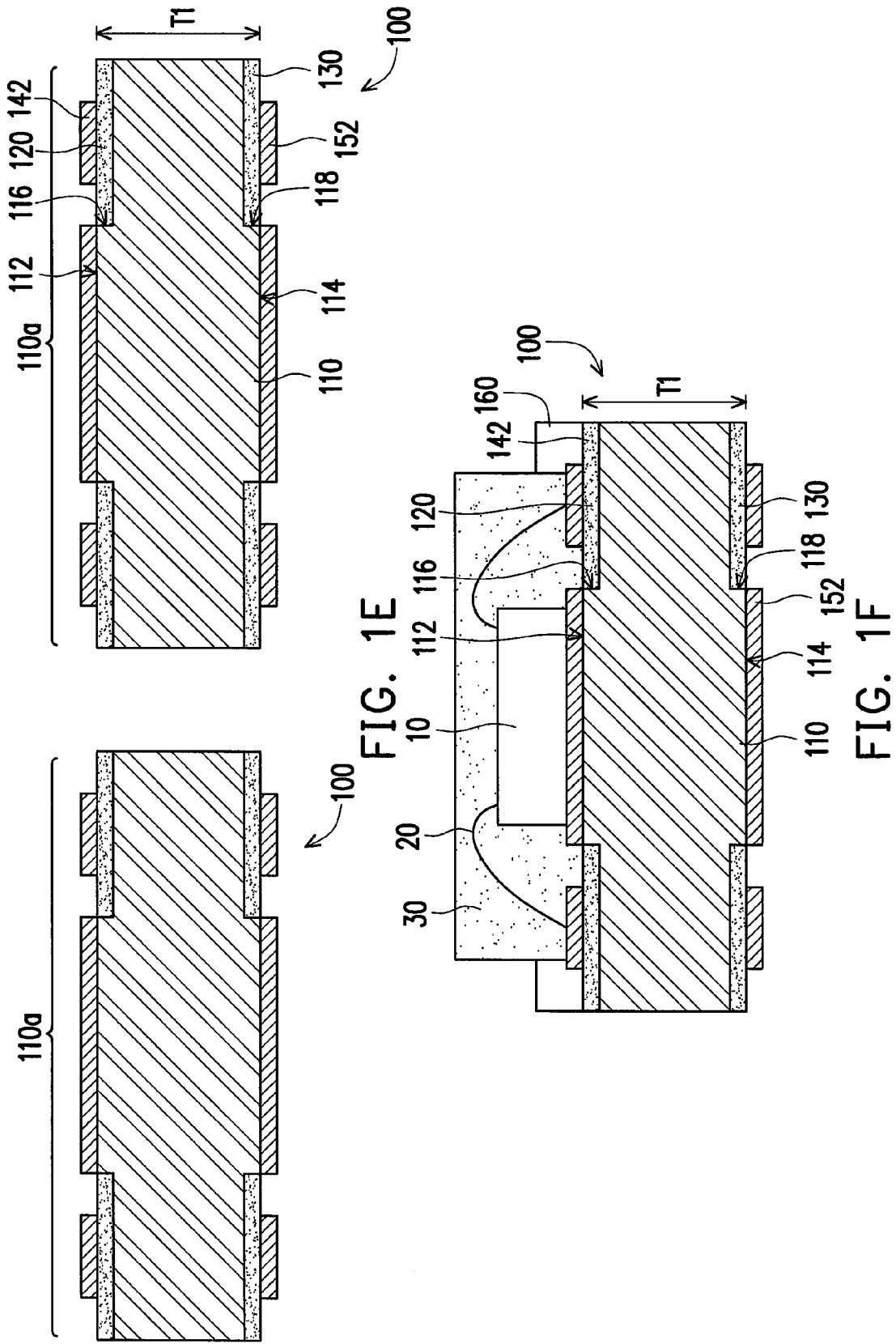

PROCESS OF FABRICATING HEAT DISSIPATION SUBSTRATE

CROSS-REFERENCE TO RELATED APPLICATION

This application is a divisional of an application Ser. No. 13/293,130, filed on Nov. 10, 2011, now pending, which claims the priority benefit of Taiwan application serial no. 100129781, filed on Aug. 19, 2011. The entirety of the above-mentioned patent application is hereby incorporated by reference herein and made a part of specification.

BACKGROUND OF THE INVENTION

1. Field of the Invention

The invention relates to a metal substrate, more particularly, the invention relates to a structure of a heat dissipation substrate adopted in a heating device and a fabricating process of the same.

2. Description of Related Art

With the progression in fabricating technology, light emitting diodes (LEDs) have gradually increased the light emitting efficiency through persistent research and improvement to further enhance the light emitting brightness thereof so as to satisfy demands in various products. In other words, other than improving the external packaging thereof, LEDs also require advanced design to achieve higher electrical power and working current, which would lead to the fabrication of LEDs with high brightness. However, when the electrical power and the working current of LEDs are increased, LEDs generate higher thermal energy which then affects the performance of LEDs or results in the malfunction of LEDs by overheat.

Conventionally, a copper substrate is adopted in a heat dissipation substrate for an etching process, so that a plurality of recesses is formed on an upper surface of the copper substrate. Thereafter, an insulating material is provided to fill the recesses, where the insulating material substantially aligns with the upper surface of the copper substrate. A copper layer is then electroplated on the upper surface of the copper substrate and the insulating material. A patterning process is performed to the copper layer to form a patterned copper layer. Finally, a plurality of independent heat dissipation substrates is formed through a singulation process to complete the fabrication of the heat dissipation substrates.

In general, when conventional heat dissipation substrate has a thickness more than 1 millimeter (mm), structures of individual heat dissipation substrates can be formed rapidly by punching as the larger heat dissipation substrate has sufficient flexural strength. Obviously, structures of individual heat dissipation substrates can also be formed through etching in the fabrication of conventional heat dissipation substrate. Since the etching process requires an additional photo-resist layer covering on the copper substrate and the copper layer of the insulating material, additional steps and fabrication cost are needed. Moreover, when the thickness of the heat dissipation substrate is reduced in half to satisfy the trend of miniaturization in packaging technology so that the thickness of the heat dissipation substrate is decreased from 1 mm to less than 0.6 mm, the heat dissipation substrate easily bends and deforms due to insufficient flexural strength, thereby affecting the subsequent packaging process.

SUMMARY OF THE INVENTION

The invention is directed to a structure of a heat dissipation substrate and a process of fabricating the same, where the process is capable of reducing fabrication steps and fabrication cost.

The invention is directed to a process of fabricating a heat dissipation substrate, the process includes the following. A metal substrate is provided. The metal substrate has an upper surface and a lower surface opposite to each other, a plurality of first recesses located on the upper surface, and a plurality of second recesses located on the lower surface. The metal substrate is divided into a plurality of carrier units and a plurality of connecting units connecting the carrier units. A first insulating material is filled into the first recesses and a second insulating material is filled into the second recesses. A first conductive layer is formed on the upper surface of the metal substrate and the first insulating material and a second conductive layer is formed on the lower surface of the metal substrate and the second insulating material. The first conductive layer and the second conductive layer are patterned to form a first patterned conductive layer and a second patterned conductive layer. The first insulating material and the second insulating material are taken as an etching mask to etch the connecting units of the metal substrate so as to form a plurality of individual heat dissipation substrates.

According to an embodiment of the invention, a method of forming the first recesses and the second recesses includes an etching.

According to an embodiment of the invention, a method of forming the first conductive layer and the second conductive layer includes an electroplating.

According to an embodiment of the invention, the metal substrate has a thickness less than 0.6 millimeter (mm).

The invention is directed to a structure of a heat dissipation substrate including a metal substrate, a first insulating material, a second insulating material, a first patterned conductive layer, and a second patterned conductive layer. The metal substrate has an upper surface and a lower surface opposite to each other, a plurality of first recesses located on the upper surface, and a plurality of second recesses located on the lower surface. The first insulating material is filled into the first recesses. The second insulating material is filled into the second recesses. The first patterned conductive layer is disposed on the upper surface of the metal substrate and a portion of the first insulating material. The second patterned conductive layer is disposed on the lower surface of the metal substrate and a portion of the second insulating material.

According to an embodiment of the invention, the first insulating material substantially aligns with the upper surface of the metal substrate.

According to an embodiment of the invention, the second insulating material substantially aligns with the lower surface of the metal substrate.

According to an embodiment of the invention, the metal substrate has a thickness less than 0.6 mm.

According to an embodiment of the invention, a material of the metal substrate includes copper, and the first insulating material and the second insulating material includes a glass fiber film.

In light of the foregoing, in the invention, the first insulating material and the second insulating material are taken as the etching mask to etch the connecting units of the metal substrate so as to form a plurality of individual heat dissipation substrates. Therefore, comparing to conventional fabrication which requires an additional photo-resist layer as the etching mask, the process of fabricating the heat dissipation substrate in the invention can reduce the fabrication steps and fabrication cost.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

FIGS. 1A to 1E are schematic cross-sectional views illustrating a flowchart of a fabrication process of a heat dissipation substrate in one embodiment of the invention.

FIG. 1F is a schematic cross-sectional view of a heating device loaded on a heat dissipation substrate in FIG. 1E.

DESCRIPTION OF EMBODIMENTS

Figure 1A:
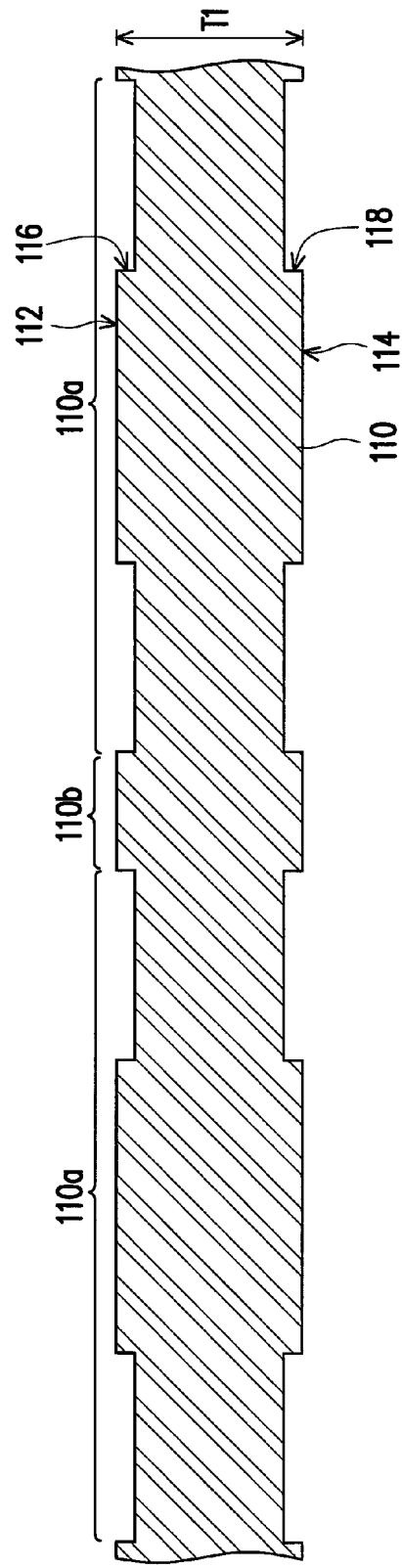

FIGS. 1A to 1E are schematic cross-sectional views illustrating a flowchart of a fabrication process of a heat dissipation substrate in one embodiment of the invention. FIG. 1F is a schematic cross-sectional view of a heating device loaded on a heat dissipation substrate in FIG. 1E. Referring to FIG. 1A, according to a method of fabricating a heat dissipation substrate of the present embodiment, a metal substrate 110 is first provided. The metal substrate 110 has an upper surface 112 and a lower surface 114 opposite to each other. The metal substrate 110 has a thickness T1 less than 0.6 millimeter (mm) and is fabricated with copper, for example.

Referring to FIG. 1A, a plurality of first recesses 116 is formed on the upper surface 112 of the metal substrate 110 and a plurality of second recesses 118 is formed on the lower surface 114 of the metal substrate 110. Here, positions of the first recesses 116 correspond to positions of the second recesses 118 respectively. In the present embodiment, the metal substrate 110 is divided into a plurality of carrier units 110a (only two carrier units 110a are illustrated in FIG. 1A) and a plurality of connecting units 110b connecting to the carrier units 110a (only one connecting unit 110b is shown in FIG. 1A). Each of the connecting units 110b is disposed between two closer first recesses 116 and between two closer second recesses 118. Here, a depth T2 of each of the first recesses 116 is preferably 0.05 mm and a depth T3 of each of the second recesses 118 is preferably 0.05 mm. In addition, a method of forming the first recesses 116 and the second recesses 118 is an etching, for instance.

Figure 1B:
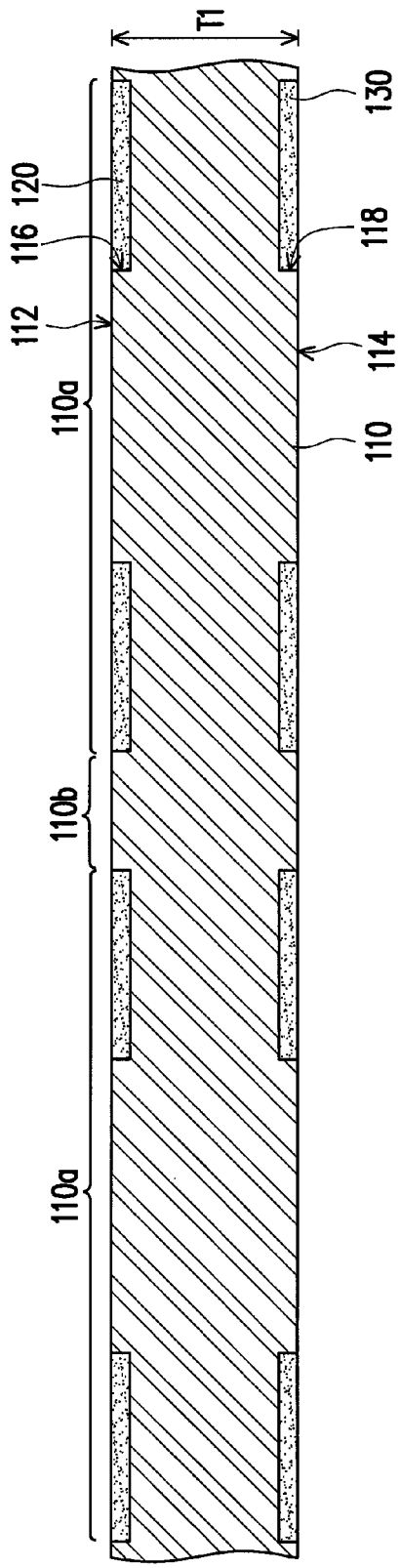

Referring to FIG. 1B, a first insulating material 120 is filled into the first recesses 116 and a second insulating material 130 is filled into the second recesses 118. Here, the first insulating material 120 and the second insulating material 130 are, for example, glass fiber films. The first insulating material 120 substantially aligns with the upper surface 112 of the metal substrate 110. The second insulating material 130 substantially aligns with the lower surface 114 of the metal substrate 110.

Thereafter, referring to FIG. 1C, a first conductive layer 140 is formed on the upper surface 112 of the metal substrate 110 and the first insulating material 120, and a second conductive layer 150 is formed on the lower surface 114 of the metal substrate 110 and the second insulating material 130. The first conductive layer 140 covers the upper surface 112 of the metal substrate 110 and the first insulating material 120 entirely. The second conductive layer 150 covers the lower surface 114 of the metal substrate 110 and the second insulating material 130 entirely. Herein, a method of forming the first conductive layer 140 and the second conductive layer 150 is, for instance, an electroplating.

Referring to FIG. 1D, the first conductive layer 140 and the second conductive layer 150 are patterned to form a first patterned conductive layer 142 and a second patterned conductive layer 152. The first patterned conductive layer 142 exposes a portion of the first insulating material 120 and the second patterned conductive layer 152 exposes a portion of the second insulating material 130. At this time, the first patterned conductive layer 142 and the second patterned conductive layer 152 also expose the connecting units 110b.

Finally, referring to FIG. 1E, the first insulating material 120 and the second insulating material 130 are taken as an etching mask to perform a single etching step for etching the connecting units 110a of the metal substrate 110, thereby forming structures of a plurality of individual heat dissipation substrates 100 (only one is displayed in FIG. 1D).

In terms of the structure, referring to FIG. 1E, the heat dissipation substrate 100 of the present embodiment includes a metal substrate 110, a first insulating material 120, a second insulating material 130, a first patterned conductive layer 142, and a second patterned conductive layer 152. The metal substrate 110 has the upper surface 112 and the lower surface 114 opposite to each other, the first recesses 116 disposed on the upper surface 112, and the second recesses 118 disposed on the lower surface 114. The thickness T1 of the metal substrate 110 is less than 0.6 mm. The first insulating material 120 is filled into the first recesses 116, where the first insulating material 120 substantially aligns with the upper surface 112 of the metal substrate 110. The second insulating material 130 is filled into the second recesses 118, where the second insulating material 130 substantially aligns with the lower surface 114 of the metal substrate 110. The first patterned conductive layer 142 is disposed on the upper surface 112 of the metal substrate 110 and a portion of the first insulating material 120. The second patterned conductive layer 152 is disposed on the lower surface 114 of the metal substrate 110 and a portion of the second insulating material 130.

In the present embodiment, the first insulating material 120 and the second insulating material 130 are taken as the etching mask to etch the connecting units 110b of the metal substrate 110 so as to form a plurality of individual heat dissipation substrates 100. Thus, comparing to conventional fabrication which requires an additional photo-resist layer as the etching mask, the process of fabricating the heat dissipation substrates 100 in the present embodiment can reduce the fabrication steps and fabrication cost.

Moreover, although the thickness of the metal substrate 110 is less than 0.6 mm in the present embodiment, that is, the thickness of the metal substrate 110 in the present embodiment is less than half of the thickness of a conventional copper substrate, the stress on the upper surface 112 and the lower surface 114 of the metal substrate is offset by the symmetrical recessive structures (that is, the first recesses 116 and the second recesses 118), the insulating materials (that is, the first insulating material 120 and the second insulating material 130), and the circuit layers (that is, the first patterned conductive layer 142 and the second patterned conductive layer 152). In other words, the heat dissipation substrate 100 of the present embodiment is a double-sided plate. Accordingly, the heat dissipation substrate 100 of the present embodiment has sufficient flexural strength.

Furthermore, in the subsequent fabricating process, referring to FIG. 1F, when a heating device 10 is electrically connected to the first patterned conductive layer 142 of the heat dissipation substrate 100 through a wire bonding process and the heating device 10 is covered using an encapsulant 30, an individual light emitting device package structure is then formed. Here, the first patterned conductive layer 142 exposed outside of the encapsulant 30 is protected by a solder-resist layer 160. The heat dissipation substrate 100 is electrically connected to an external circuit (not shown)

through the second patterned conductive layer 152 so as to expand the application scope of the heat dissipation substrate 100.

In summary, the first insulating material and the second insulating material are taken as the etching mask in the invention to etch the connecting units of the metal substrate for forming a plurality of individual heat dissipation substrates. Therefore, comparing to conventional fabrication which requires an additional photo-resist layer as the etching mask, the process of fabricating the heat dissipation substrate in the invention can reduce the fabrication steps and fabrication cost. Also, since the thickness of the metal substrate in the invention is less than 0.6 mm and the upper surface and the lower surface of the metal substrate are disposed with the recessive structures, the insulating materials, and the patterned conductive layers simultaneously, the stress on the upper surface and the lower surface of the metal substrate can be offset for the heat dissipation substrate of the invention to have sufficient flexural strength. In addition, when the heating device is electrically connected to the patterned conductive layer through a wire bonding process to form a packaging structure, this packaging structure has a thinner packaging thickness.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A process of fabricating a heat dissipation substrate, the process comprising:
    providing a metal substrate having an upper surface and a lower surface opposite to each other, wherein a plurality of first recesses located on the upper surface and a plurality of second recesses located on the lower surface are formed on the metal substrate, the metal substrate is divided into a plurality of carrier units and a plurality of connecting units connecting the carrier units, and the metal substrate has a thickness less than 0.6 millimeter (mm);
    filling a first insulating material into the first recesses and a second insulating material into the second recesses;
    forming a first conductive layer on the upper surface of the metal substrate and the first insulating material and a second conductive layer on the lower surface of the metal substrate and the second insulating material;
    patterning the first conductive layer and the second conductive layer to form a first patterned conductive layer and a second patterned conductive layer; and
    taking the first insulating material and the second insulating material as an etching mask to etch the connecting units of the metal substrate so as to form a plurality of individual heat dissipation substrates.

2. The process of fabricating the heat dissipation substrate as claimed in claim 1, wherein a method of forming the first recesses and the second recesses comprises an etching.

3. The process of fabricating the heat dissipation substrate as claimed in claim 1, wherein a method of forming the first conductive layer and the second conductive layer comprises an electroplating.

* * * * *